United States Patent [19]

Golder et al.

[11] Patent Number: 4,644,269
[45] Date of Patent: Feb. 17, 1987

[54] TEST FIXTURE HAVING FULL SURFACE CONTACT HINGED LID

[75] Inventors: Willis E. Golder, Holliston; Joseph A. Ierardi, Norwood; Carl Beety, Jr., North Attleboro, all of Mass.

[73] Assignee: Pylon Company, North Attleboro, Mass.

[21] Appl. No.: 499,279

[22] Filed: May 31, 1983

[51] Int. Cl.⁴ ............................................ G01R 31/02
[52] U.S. Cl. ............................ 324/158 F; 324/73 PC
[58] Field of Search ........... 324/158 R, 73 PC, 158 F, 324/158 P; 339/75 MP

[56] References Cited

U.S. PATENT DOCUMENTS 4,138,186  2/1979  Long et al. ................. 324/158 P X

FOREIGN PATENT DOCUMENTS 917137  4/1982  U.S.S.R. ......................... 324/158 R

Primary Examiner—Reinhard J. Eisenzopf
Assistant Examiner—Stephen M. Baker
Attorney, Agent, or Firm—Weingarten, Schurgin, Gagnebin & Hayes

[57] ABSTRACT

The test fixture for automatic testing equipment of the present invention includes a cover pivotally mounted to an electronic test bed, and means mounted to the cover and operative as the cover is closed to provide full surface contact with an electrical circuit device to be tested. In preferred embodiment, the test fixture includes a spring-loaded lid that is snap-latchable to, and push-button releasable from, a test bed. A lid panel-inset is rotatably mounted to the lid at a preselected acute angle thereto. The angle is selected such that the panel-inset provides full surface contact with an electrical circuit to be tested when the lid engages the electrical device. The panel-inset rotates to maintain full surface contact while the lid is latched to the test bed. The lid panel-inset provides an abutment surface that is always equally distant from the electrical circuit device to be tested which distributes the impact of the lid panel-inset uniformly over the entire surface area of the electrical circuit device to be tested, thereby substantially eliminating device misalignment occasioned by non-uniform forces and torques.

4 Claims, 4 Drawing Figures

TEST FIXTURE HAVING FULL SURFACE CONTACT HINGED LID

FIELD OF THE INVENTION

This invention is drawn to the field of automatic test fixtures for automatic testing equipment, and more particularly, to a novel test fixture for such equipment having a full surface contact hinged lid.

BACKGROUND OF THE INVENTION

Test fixtures for automatic testing equipment are commonly employed to removably retain an electronic circuit device in electrical communication with automatic testing equipment. The testing equipment is operative to ascertain whether the electronic circuit device conforms to a predetermined standard of quality, whereby functional devices may be readily identified and separated from defective ones. Vacuum trays, parallel press plates slidably mounted on spaced arms, and hinged lids have been employed to removably retain the electrical circuit devices to be tested in electrical communication with the automatic testing equipment. The fixtures having vacuum trays and parallel press plates, however, are disadvantageous, among other things, due to their use of comparatively complex and costly electro-mechanical actuating technology that is subject to repeated and costly malfunction. The fixtures having hinged covers are disadvantageous, among other things, due to the phenomenon that during closure the hinged covers impact an edge of the electrical circuit device to be tested which imparts an unbalanced force thereto that often effects an undesirable movement of the device out of electrical alignment with the test bed, neccesitating the repositioning of the device in the test fixture, and if unnoticed, possibly producing erroneous test results.

SUMMARY OF THE INVENTION

The novel test fixture for automatic testing equipment of the present invention includes a cover pivotally mounted to an electronic test bed, and contemplates means mounted to the cover and operative as the cover is closed to provide full surface contact with an electrical circuit device to be tested. The impact of the cover is thereby uniformly distributed over the surface of the electrical circuit device, which eliminates the possibility of unbalanced torque and force which could induce electrical circuit device misalignment. The novel test fixture for automatic testing equipment of the present invention in preferred embodiment includes a spring-loaded lid that is snap-latchable to, and push-button releasable from, a test bed. A lid panel-inset is mounted to the lid for controlled rotation between a first position selected to provide full surface contact with an electrical circuit to be tested when the lid just touches the electrical device, and a second position selected to maintain full surface contact when the lid is latched to the test bed. As the lid is snapped closed, the lid panel-inset controllably rotates to provide an abutment surface everywhere equally distant from the electrical circuit device to be tested which distributes the impact of the lid panel-inset uniformly over the entire surface area of the electrical circuit device to be tested, thereby substantially eliminating device misalignment occasioned by non-uniform forces and torques. A registered array of upstanding signal contacts, preferably spring-loaded POGO contacts, is mounted to the test bed to provide selective electrical connection between the electrical circuit device to be tested and the associated automatic testing equipment.

BRIEF DESCRIPTION OF THE DRAWINGS

Other advantages and features will become apparent as the invention becomes better understood by referring to the following exemplary and non-limiting detailed description of the preferred embodiment, and to the drawings, wherein.

DETAILED DESCRIPTION OF THE PREFERRED EMBODIMENT

Figure 1:
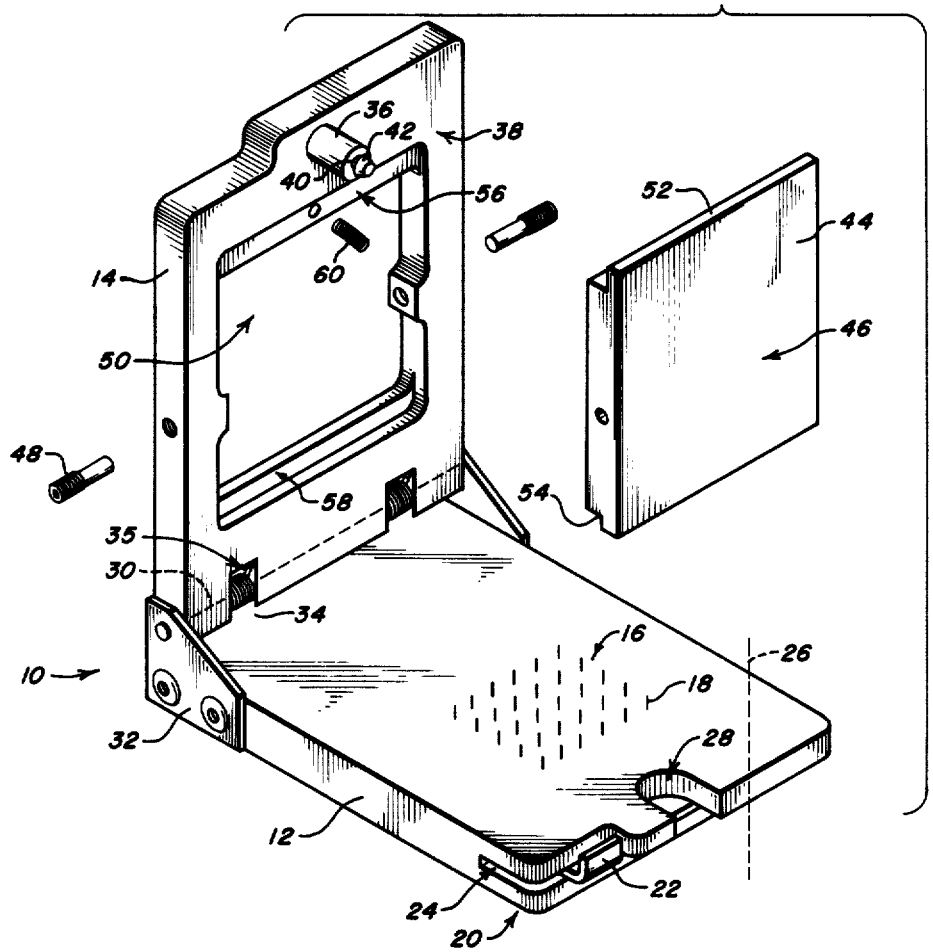
FIG. 1 is an exploded perspective view of a test fixture having a full surface contact hinged lid according to the present invention.

Referring now to FIG. 1, generally designated at 10 is a novel test fixture having a full surface contact hinged lid according to the present invention. The test fixture 10 includes a test bed 12, and a lid 14 pivotally mounted to the test bed 12. A registered array generally designated 16 of upstanding signal contacts 18 is fixably mounted to the test bed 12 to provide selected electrical connection between an electronic circuit device to be tested and automated testing equipment, both not illustrated. Preferably, the upstanding signal contacts are POGO spring-loaded contacts.

A push-button release mechanism generally designated 20 is mounted to the end of the test bed 12 remote from the end thereof at which the lid 14 is pivotally mounted. The push-button release mechanism 20 includes an arm 22 pivotally mounted in a slot 24 provided therefor in the test bed 12 for pivotal motion about an axis 26. The end of the test bed 12 at which the release mechanism 20 is mounted is provided with an opening generally designated 28 that exposes a portion of the arm 22. A spring, not shown, is mounted in the slot 24 to bias the arm 22 outwardly. A pin, not shown, is mounted in the slot 24 through a slot provided therefor in the arm 22, also not shown, that are cooperative to prevent the arm 22 from swinging outwardly as a result of the bias provided by the spring. As will appear more fully below, the exposed portion of the arm 22 cooperates with a beveled post to be described to snap-latch the cover 14 to the test bed 12 in a closed condition.

The cover 14 is pivotally mounted to the test bed 12 on a shaft 30 that is journaled in apertures provided therefor in metallic plates 32 fastened to the sides of the test bed 12. Torsion springs 34 are slidably mounted on the shaft 30 and positioned in apertures generally designated 35 provided therefor in the cover 14. The springs 34 are operative to bias the cover 14 upwardly into the illustrated open condition. An upstanding abutment is fastened to the concealed end of the test bed 12 against which the cover 14 is stopped in its spring-induced pivotal movement.

An elongated post 36 is perpendicularly fastened to a generally planar interior surface 38 of the cover 14 proximate to the end thereof that is remote from the pivotally mounted end. The elongated post 36 has a neck portion 40 of comparatively narrow diameter that terminates in a conical head 42 having a comparatively larger diameter. When the cover 14 is rotated downwardly and to the side, the elongated post 36 passes through the opening 28 provided therefor in the test bed 12, and the conical head 42 contacts the exposed portion of the arm 22. The arm 22 thereby is urged inwardly until the base of the conical head clears the arm at which time the resiliently biased arm is urged outwardly and snap-latches the cover 14 to the test bed 12. To open the test fixture, the application of force to the arm 22 urges it inwardly until it releases the base of the conical head, at which time the springs 34 urge the cover 14 upwardly.

A cover panel-inset 44 having a generally planar surface 46 is journaled on its sides on pins 48 threadably fastened to the cover 14 for rotary motion in an aperture generally designated 50 provided therefor in the cover 14. The cover panel-inset 44 has a top end flange 52 having a comparatively small thickness and a bottom end flange 54 having a comparatively large thickness. A shoulder generally designated 56 having a comparatively large thickness is provided along the top end of the opening 50 and a shoulder generally designated 58 having a comparatively small thickness is provided along the bottom end of the opening 50. The shoulder 58 and the flange 54 cooperate to limit the angular rotation of the cover panel-inset 44 in one direction, and the shoulder 56 and the flange 52 cooperate to limit the angular rotation of the cover panel-inset 44 in the opposite direction. A spring 60 is mounted between the shoulder 56 and the flange 52 to bias the panel-inset 44 to a selected position. By varying the thickness of each of the flanges 52 and 54, and the thickness of the cooperative shoulders 56 and 58, the angle which the planar surface 46 of the cover panel-inset 44 makes with the planar surface 38 of the cover 14 can be controllably selected.

Figure 2A:
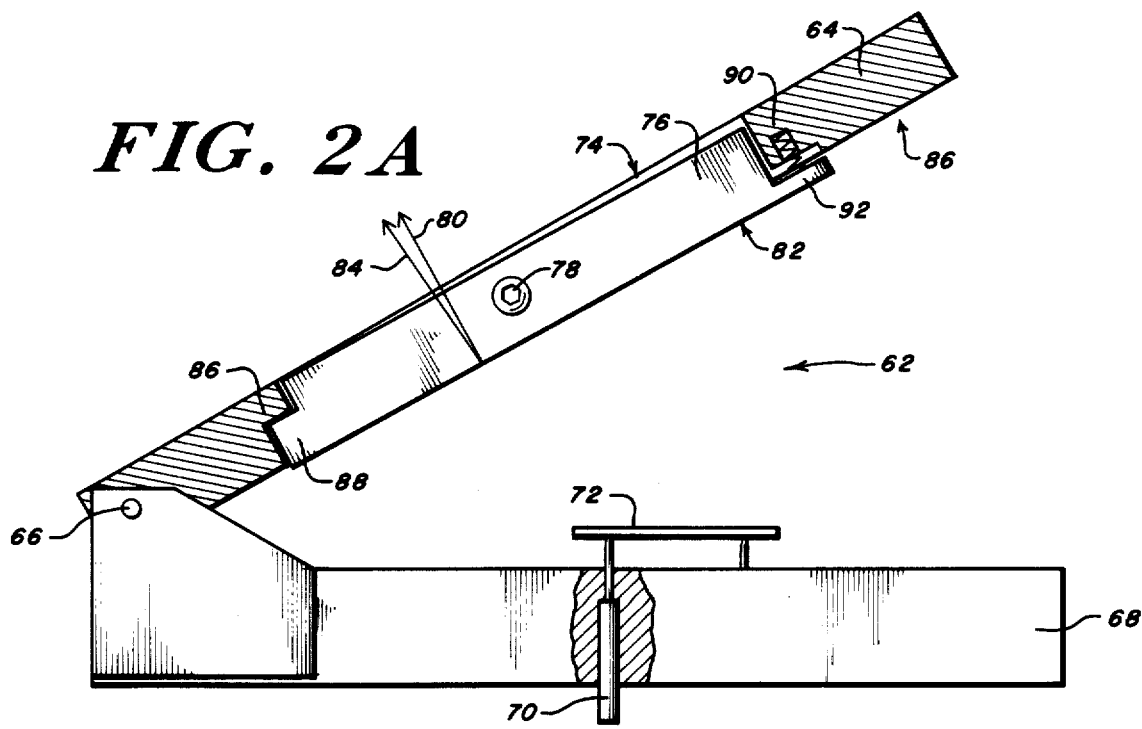
FIG. 2A is a sectional view illustrating the open condition of the test fixture having a full surface contact hinged lid according to the present invention.

Referring now to FIG. 2A, generally designated at 62 is a sectional view illustrating the open condition of the test fixture having a full surface contact hinged lid of the present invention. A cover member 64 is pivotally mounted as at 66 to a test bed 68. A plurality of upstanding spring-loaded signal contacts 70, two of which are illustrated, are mounted to the test bed 68 for providing selected electrical connection between an electronic circuit device 72 to be tested and automatic testing equipment resident software, not illustrated. The cover 64 is provided with an opening generally designated 74 into which a panel-inset 76 is rotatably mounted as at 78. The panel-inset 76 rotates between a first limit position, where a line 80, normal to a plane generally designated 82 defined by the inside face of the panel-inset 76, intersects a line 84, normal to a plane generally designated 86 defined by the inside planar face of the cover member 64, at a preselected non-zero acute angle θ, and a second limit position where the line 80 is generally parallel to the line 84 as shown in FIG. 2C. The thickness of a shoulder 86 provided along the bottom edge of the opening 74 cooperates with the thickness of a flange 88 provided along the confronting edge of the panel-inset 76 to limit the rotation of the panel-inset 76 in one direction to provide the first limit position, where the panel-inset 76 intersects the cover 64 at the preselected non-zero acute θ angle. Likewise, the thickness of a shoulder 90 provided along the top edge of the opening 74 cooperates with a flange 92 provided on the confronting edge of the panel-inset 76 to limit the rotation of the panel-inset 76 in the opposite angular direction to provide the second limit position where the panel-inset 76 is substantially parallel with the cover 64.

Figure 2B:
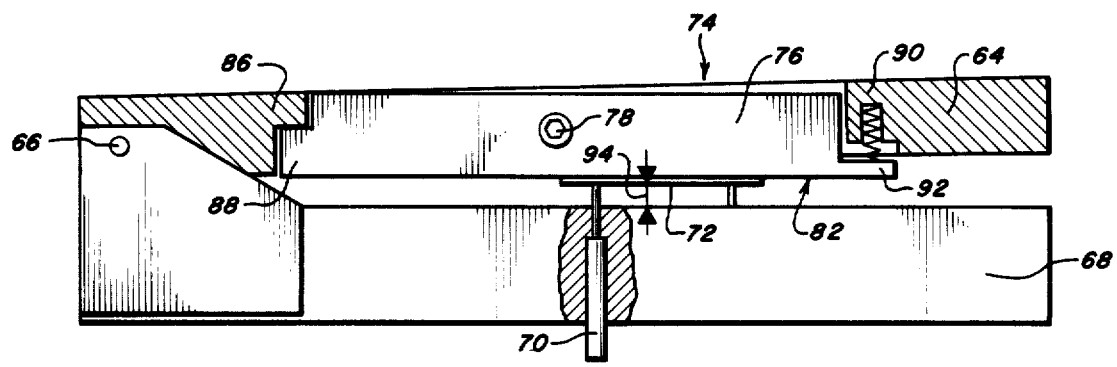
FIG. 2B is a sectional view illustrating the condition when the lid panel-inset just touches an electronic circuit device to be tested of the test fixture having a full surface contact hinged lid according to the present invention.
Figure 2C:
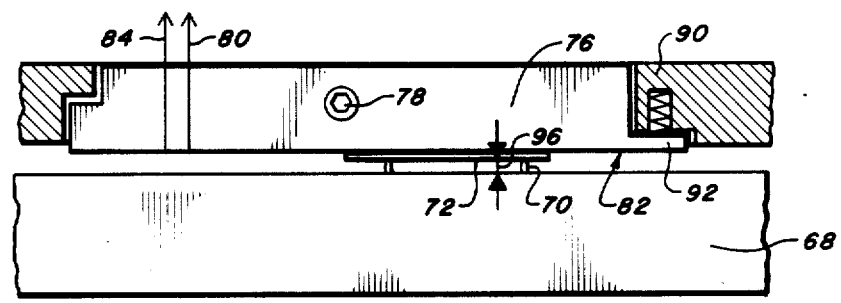
FIG. 2C is a fragmentary sectional view illustrating the latched condition of the test fixture having a full surface contact hinged lid according to the present invention.

As shown in FIG. 2B, as the cover 64 is pivoted downwardly, a position is reached at which the panel-inset 76 just touches the electronic circuit device 72 to be tested. The preselected non-zero acute angle θ is selected such that, in the first limit position, the plane 82 defined by the inside face of the panel-inset 76 makes full surface contact with the plane of the electronic circuit device 72. With further downward movement, the cover 64 traverses the remaining distance to the latched condition illustrated in FIG. 2C, and the cover panel-inset 76 rotates in a counterclockwise direction about the axis of rotation 78 to the second limit position. In this manner, full surface contact is maintained between the plane 82 defined by the inside face of the panel-inset 76 and the plane defined by the top surface of the electronic circuit device 72 to be tested. The force is thereby uniformly distributed across the entire face of the electronic circuit device to be tested, eliminating any unbalanced forces or torques and the undesirable electronic circuit device misalignment occasioned thereby. It will be appreciated that as the cover 64 traverses the distance between the condition where the panel-inset 64 just contacts the device 72, to the position illustrated in FIG. 2C, where the cover 64 is latched to the test bed 68, the signal contacts of the spring-loaded POGOs 70 displace axially downwardly a distance "s," where "s" is the difference in the length between an arrow 94 (FIG. 2B) and an arrow 96 (FIG. 2C). In FIG. 2B, the undersurface 82 of the panel-inset 76 is horizontal. In FIG. 2C, the surface 82 is still horizontal, but is vertically displaced by a distance that substantially equals the distance "s." The panel-inset 76 travel is almost entirely vertical because of the small angle θ. The distance "s" also equals the vertical component of the travel of the panel-inset pivot point 78 from its position in FIG. 2B to its position in FIG. 2C.

It will be appreciated that many modifications of the presently disclosed invention are possible without departing from the inventive concept.

What is claimed is:
1. An automatic test fixture, comprising:
 a test bed for receiving an electronic circuit device to be tested;
 a generally planar cover panel defining a first planar surface and having four side portions cooperative to define an opening formed centrally therethrough;
 means for pivotally mounting said generally planar cover panel to said test bed about a first axis defined along confronting ends thereof;
 a generally planar cover panel-inset defining a second planar surface and dimensioned to be at least partially received in said opening of said cover panel;
 first means connected to said cover panel and to said cover panel-inset for mounting said cover panel-inset for rotary motion about a second axis different from and generally parallel to said first axis that is defined in said opening of said cover panel;

second means cooperative with said first means for angularly limiting the rotary motion of said cover panel-inset between a first preselected rotary position selected such that the normal to said first planar surface defines a preselected non-zero acute angle with the normal to said second planar surface, and a second preselected rotary position selected such that the normals are generally parallel; said second means includes first and second flanges provided on opposite ends of said cover panel-inset that are cooperative with confronting shoulders provided on opposite side portions defining said opening provided in said cover panel to define said first and said second preselected rotary positions.

2. The test fixture of claim 1, further including third means, coupled to said cover and to said cover panel-inset for biasing said cover panel-inset normally to said first preselected rotary position.

3. The test fixture of claim 1, wherein said test bed includes a registered array of upstanding spring-loaded signal contacts.

4. The test fixture of claim 2, wherein said third means includes a spring member mounted between one of said shoulders and the confronting one of said flanges.

* * * * *

UNITED STATES PATENT AND TRADEMARK OFFICE
CERTIFICATE OF CORRECTION

PATENT NO. : 4,644,269
DATED : February 17, 1987
INVENTOR(S) : Willis E. Golder, Joseph A. Ierardi, Carl Beety, Jr.

It is certified that error appears in the above-identified patent and that said Letters Patent is hereby corrected as shown below:

In the Abstract

Line 12, "lid engages" should read --lid just engages--

Column 4, line 63, "first means" should begin a new paragraph

Signed and Sealed this

Fifth Day of July, 1988

Attest:

DONALD J. QUIGG

Attesting Officer

Commissioner of Patents and Trademarks